United States Patent
Lung et al.

(10) Patent No.: US 10,157,671 B1
(45) Date of Patent: Dec. 18, 2018

(54) FAST SWITCHING 3D CROSS-POINT ARRAY

(71) Applicant: MACRONIX INTERNATIONAL CO., LTD., Hsinchu (TW)

(72) Inventors: Hsiang-Lan Lung, Ardsley, NY (US); Wei-Chih Chien, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/702,208

(22) Filed: Sep. 12, 2017

(51) Int. Cl.
  *G11C 11/00* (2006.01)
  *G11C 13/00* (2006.01)
(52) U.S. Cl.
  CPC ........ *G11C 13/0069* (2013.01); *G11C 13/004* (2013.01); *G11C 13/0023* (2013.01)
(58) Field of Classification Search
  CPC .................................................. G11C 13/0002
  USPC .......................................................... 365/148
  See application file for complete search history.

(56) References Cited

U.S. PATENT DOCUMENTS

| | | | |
|---|---|---|---|
| 5,687,112 A | 11/1997 | Ovshinsky | |
| 6,579,760 B1 | 6/2003 | Lung | |
| 8,310,858 B2 | 11/2012 | Ito | |
| 2009/0067216 A1 | 3/2009 | Kim et al. | |
| 2009/0129140 A1* | 5/2009 | Kawazoe | G11C 13/0007 365/148 |
| 2011/0026299 A1 | 2/2011 | Kanno et al. | |
| 2014/0104923 A1 | 4/2014 | Baek et al. | |
| 2014/0269000 A1* | 9/2014 | Ichihara | G11C 13/0069 365/148 |
| 2016/0148678 A1 | 5/2016 | Park et al. | |
| 2016/0196876 A1 | 7/2016 | Lee et al. | |

* cited by examiner

*Primary Examiner* — Hoai V Ho

(74) *Attorney, Agent, or Firm* — Haynes Beffel & Wolfeld LLP

(57) ABSTRACT

An integrated circuit includes a memory array including a plurality of memory cells disposed at respective cross points of a plurality of first access lines and a plurality of second access lines. A selected memory cell has a first threshold voltage Vth(S) of set state and a second threshold voltage Vth(R) of reset state. Control circuitry is configured to apply a write voltage Vw to the selected first access line during a write operation, to apply a read voltage Vr to the selected first access line during a read operation, and to apply a same inhibit voltage Vu to unselected first and second access lines during the write and read operations, where $\frac{1}{2}Vw > Vu > Vw - Vth(S)$.

20 Claims, 8 Drawing Sheets

FAST SWITCHING 3D CROSS-POINT ARRAY

BACKGROUND

Field

The present technology relates to integrated circuit memory technologies, including technologies using resistive memories and methods for operating such devices.

Description of Related Art

There are many different types of memory, including random access memory (RAM), read only memory (ROM), dynamic random access memory (DRAM), synchronous dynamic random access memory (SDRAM), resistive memory, and flash memory, among others. Types of resistive memory include phase change memory (PCM), conducting bridge memory (CBRAM), and metal oxide based resistive random access memory (ReRAM). Various resistive memory devices include arrays of cells organized in a cross-point architecture, such as described in U.S. Pat. No. 6,579,760, entitled SELF-ALIGNED, PROGRAMMABLE PHASE CHANGE MEMORY, issued 17 Jun. 2003, by Lung.

In such architectures, the capacitance and resistance of control lines, such as word lines and bit lines, can increase with the density of the memory array. The higher capacitance and resistances can increase the time and voltages required for operating the array, increasing the power, for example, required for pre-charging and discharging of the bit lines and word lines.

It is desired to provide a high density memory array, which can operate faster with lower power.

SUMMARY

Technologies are described for operation of a cross-point memory array for one or more of increased speed, lower voltages and reduced power consumption during operations.

An integrated circuit described herein comprises a plurality of memory cells disposed at cross points of a plurality of first access lines (e.g. bit lines) and a plurality of second access lines (e.g. word lines), and including at least one block of cells, in which cells share a first access line with one of a row and column including more than one other cell in the same block, and a second access line with another one of the row and column including more than one other cell in the same block. A selected memory cell in the plurality of memory cells being disposed between a selected first access line and a selected second access line. Each of the plurality of memory cells includes a cell structure that provides switch function and data storage function. In one preferred embodiment, the cell structure comprises a switch element such as an ovonic threshold switch and a memory element of phase change material. The memory cells in the plurality have a first threshold voltage Vth(S) for selection of a cell when the selected memory cell is in a set state (lower resistance) and a second threshold voltage Vth(R) for selection of a cell when the selected memory cell is in a reset state (higher resistance), due for example to differences in a voltage dividing effect in the cell in the set and reset states. In embodiments based on ovonic threshold switch elements, the thresholds are voltages across the cell at and above which the ovonic threshold switch conducts current in an "on" state, allowing current flow through the memory element, and below which the ovonic threshold switch remains in an "off" state.

In multilevel memory cells which represent data in more than two different resistance ranges, the threshold voltages can have more than two nominal values, and Vth(S) and Vth(R) correspond to the thresholds for lowest and highest resistance ranges, respectively.

The integrated circuit described includes control circuitry configured to apply a write voltage Vw to a selected first access line (which can be designated a bit line) during a write operation in a block of cells, to apply a read voltage Vr to a selected first access line during a read operation in the block of cells, and to apply a same inhibit voltage Vu to unselected first access lines in the block of cells during the write and read operations, where ½Vw>Vu>Vw−Vth(S). The cells in a block of cells share one of a first access line and a second access line with more than one other cell in the same block. The write voltage Vw has a range: Vth(S)+Vu>Vw>Vth(R). The control circuitry can be configured to apply ground, or another constant reference voltage, to the selected second access line (which can be designated a word line) and to apply Vu to unselected second access lines in the block, in the write operation and in the read operation. The control circuitry can be configured so that upon a transition between a write operation and a read operation, a transition from one write operation to another write operation, a transition in a write operation from applying a write pulse to a verify step, and a transition from one read operation to another read operation, the bias voltages applied to first access lines unselected in both operations remains unchanged. Since the unselected first access lines can be the majority of the first access lines in the selected block of memory cells, and a relatively small number of such first access lines may change from unselected to selected in any given transition, biasing operations that leave them unchanged substantially reduce the power required during the transition. Also, since the unselected second access lines can be the majority of the second access lines in the selected block of memory cells, and a relatively small number, or even none, of such second access lines may change from unselected to selected in any given transition, biasing operations that leave them unchanged substantially reduce the power required during the transition.

The switch element can comprise an ovonic threshold switch, and the memory element can comprise a phase change material, such as a chalcogenide, or other programmable resistance material.

In an event in which the control circuitry is configured so that Vr−Vu<Vu, the integrated circuit described includes a plurality of sense amplifiers coupled to the plurality of first access lines. Current source circuits can be coupled to the first access lines with the sense amplifiers to limit or control the current magnitudes during the read and write pulses.

In an event in which the control circuitry is configured so that Vr−Vu>Vu, the integrated circuit described includes a plurality of sense amplifiers coupled to the plurality of second access lines. Current source circuits can be coupled to the second access lines with the sense amplifiers to limit or control the current magnitudes during the read and write pulses.

A method described is related to writing a selected memory cell in a memory block, which includes a plurality of first access lines and a plurality of second access lines. The selected memory cell has a first threshold voltage Vth(S) and a second threshold voltage Vth(R) when the memory element is in a set state and a reset state, respectively. The method includes applying the same inhibit voltage to unselected first and second access lines in read and write operations. In one example, a write operation can include applying a write voltage pulse Vw to a selected first access line connecting the selected memory cell; applying a verify read voltage Vr to the selected first access line; and applying a same inhibit voltage Vu to unselected first and second access lines in the instances of applying the write pulse and applying the verify read voltage, where ½Vw>Vu>Vw−Vth(S).

In an event of Vr−Vu<Vu, the method described comprises sensing a current through the selected memory cell using a sense amplifier coupled to the selected first access line.

In an event of Vr−Vu>Vu, the method described comprises sensing a current through the selected memory cell using a sense amplifier coupled to the selected second access line.

Other aspects and advantages of the present technology can be seen on review of the figures, the detailed description and the claims.

DETAILED DESCRIPTION

A detailed description of embodiments of the present technology is provided with reference to the FIGS. 1-10.

Figure 1:
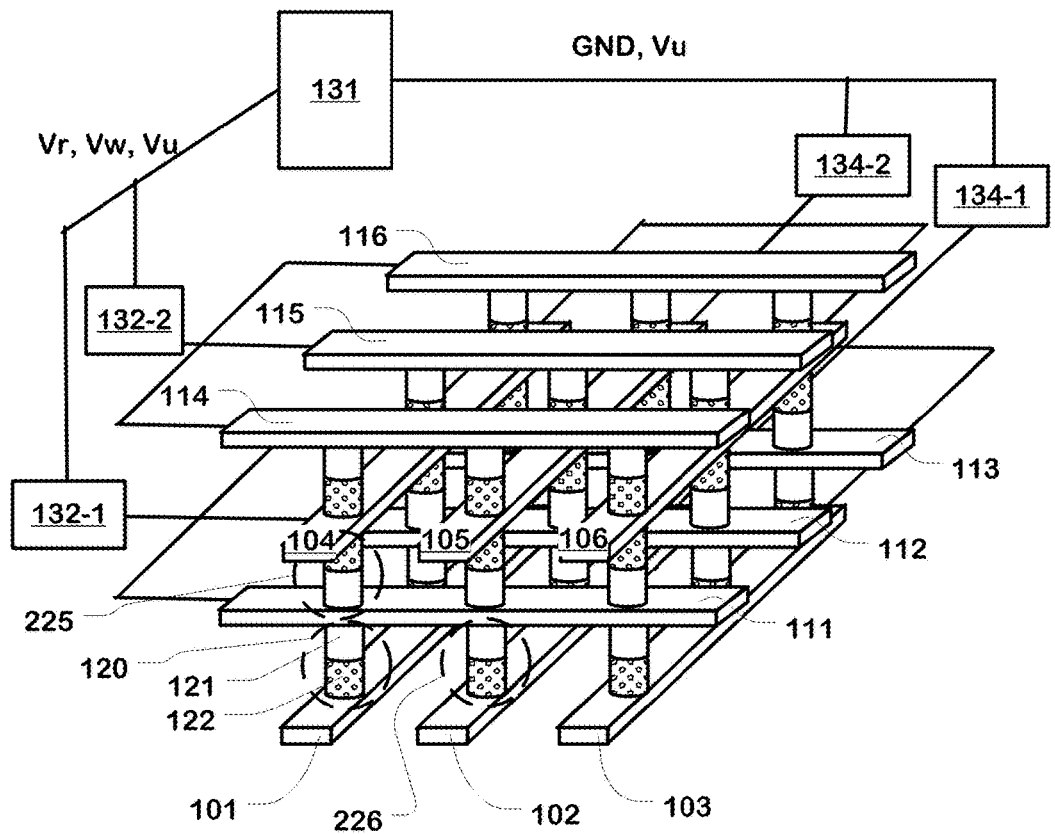
FIG. 1 is a perspective view of a 3D cross-point array.

FIG. 1 is a perspective view of a 3D cross-point array. The 3D cross-point array comprises a plurality of memory cells, including memory cell 120, disposed at respective cross points of a plurality of first access lines, such as bit lines, (e.g. 111, 112, 113, 114, 115, and 116), and a plurality of second access lines, such as word lines (e.g. 101, 102, 103, 104, 105, and 106). Each memory cell has a cell structure that provides switch function and data storage function. The threshold for the switch function can be different for different data storage states. In this example the cell has a cell structure including a switch element (e.g. 121) and a memory element (e.g. 122).

In the illustration, a first level in the 3D cross-point array is interposed between a first patterned conductor layer of second access lines, including second access lines 101, 102, and 103, and a second patterned conductor layer of first access lines, including first access lines 111, 112, and 113. A second level in the 3D cross-point array is interposed between the second patterned conductor layer of first access lines, including first access lines 111, 112, and 113, and a third patterned conductor layer of second access lines, including second access lines 104, 105, and 106. A third level in the 3D cross-point array is interposed between the third patterned conductor layer of second access lines, including second access lines 104, 105, and 106, and a fourth patterned conductor layer of first access lines, including first access lines 114, 115, and 116. In this embodiment, the consecutive levels share a patterned conductor layer of first or second access lines, and the memory cells are inverted such that the memory elements can be in contact with or proximal to a second access line and the switch element can be in contact with or proximal to a first access line. In some embodiments, each level can have its own conductive layers of first and second access lines. In some embodiments, the memory cells are not inverted such that the switch elements can be in contact with the first access lines or second access lines. An array implemented in the configuration of FIG. 1 can have many levels, and many first access lines and second access lines in each level for formation of very high density memory devices. Other 3D configurations can be implemented.

The 3D cross-point array is coupled to and in electrical communication with a plurality of first drivers 132-1, 132-2 and a plurality of second drivers 134-1, 134-2, where the first and second drivers can include address decoders and bias voltage selectors to apply bias voltages to selected and unselected first access lines and second access lines. Control circuitry 131 is coupled to the plurality of first drivers 132-1, 132-2 and the plurality of second drivers 134-1, 134-2, and other resources in the circuit to execute write operations, read operations and other memory device operations which require applying sequences of voltage pulses to the memory cells in the array. Although the figure shows that the drivers are shared among the access lines, the circuits are configured to allow individual selecting and biasing of the access lines using decoders and switches. Details of bias arrangements are described with reference with FIGS. 4-8.

The control circuitry 131 controls the drivers during read operations to apply voltages on the first and second access lines connected to a given cell at their cross point include: Vr and ground (Vref) for a selected cell (e.g. 120), Vr and Vu for unselected cells (e.g., 225, 226) on the same first access line (e.g. 111) but different second access lines (e.g., 104, 102), or Vref and Vu on unselected cells on the same second access line (e.g. 101) but different first access lines (e.g. cell at cross point of access lines 101 and 112), and Vu and Vu to all other unselected cells (e.g. cell at cross point of access lines 112 and 103). In embodiments described herein, the voltages applied during set or reset write operations on the first and second access lines connected to a given cell at their cross point include: Vw and ground (Vref) for a selected cell (e.g. 120), Vw and Vu for an unselected cells (e.g. 225, 226) on the same first access line (e.g. 111) but different second access lines (e.g., 104, 102), or Vref and Vu on unselected cells on the same second access line (e.g. 101) but different first access lines (e.g. cell at cross point of access lines 101 and 112), and Vu and Vu to all other unselected cells (e.g. cell at cross point of access lines 112 and 103). The same inhibit voltage Vu can be applied in both read and write operations so that a transition between a read of cell 120 and a write of cell 120 does not require any voltage changes on access lines other than access line 111, substantially reducing the power required for transition between a read and a write.

Sense amplifiers (not shown) can be configured to connect to the first access lines or second access lines. In embodiments of the technology described herein, the sense amplifiers are coupled to the one of the first and second access lines on which current source circuits, such as current mirror based load circuits, are connected that limit current during read and write voltage pulses.

Figure 2:
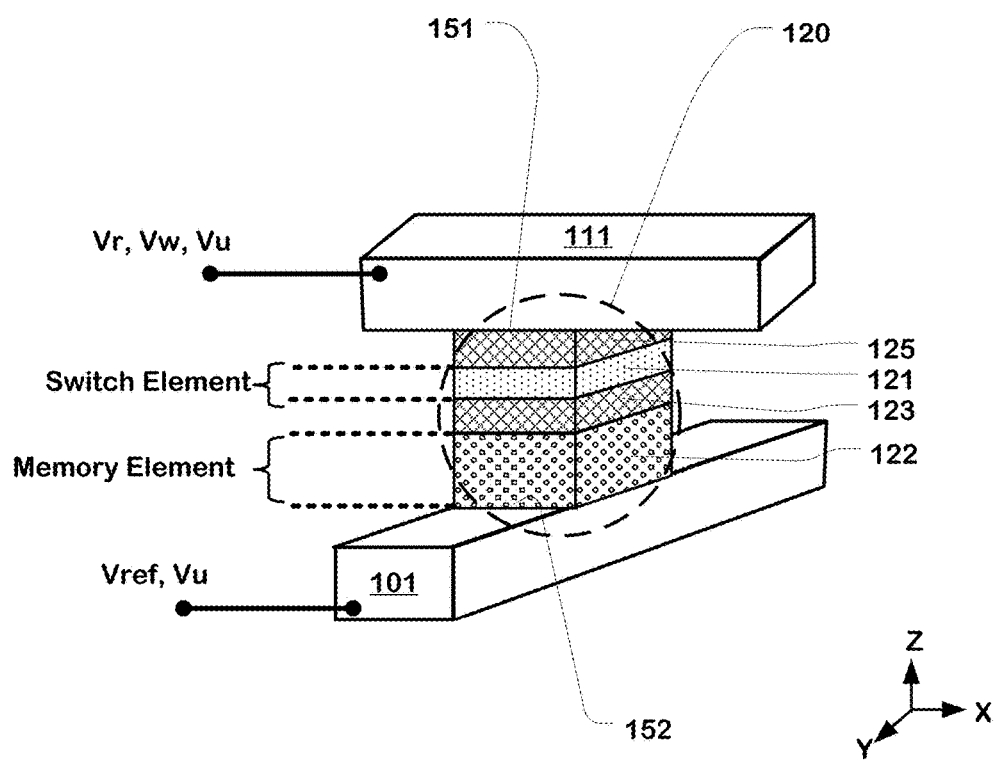
FIG. 2 is a close-up view of a memory cell 120 in FIG. 1.

FIG. 2 is a close-up view of an example memory cell 120 in FIG. 1. Memory cell 120 has a first end 151 in current flow contact with the first access line (bit line) 111, and has a second end 152 in current flow contact with the second access line (word line) 101. Memory cell 120 includes a switch element 121 proximal to the first access line 111, and a memory element 122 proximal to the second access line 101. A first barrier layer 123 is disposed between the switch element 121 and the memory element 122. A second barrier layer 125 is disposed between the switch element 121 and the first access line 111. The switch element 121, for example, can be a two-terminal, bi-directional ovonic threshold switch (OTS), which comprises a chalcogenide material.

In other embodiments, the switch element 121 can comprise other types of devices, such as a diode.

In one example, the switch element 121 can comprise a layer of chalcogenide selected for use as an ovonic threshold switch, such as $As_2Se_3$, ZnTe, and GeSe, and has for example a thickness of about 5 nm to about 25 nm, preferably about 15 nm. In some embodiments, the switch element 121 can comprise a chalcogenide in combination with one or more elements from the group consisting of tellurium (Te), selenium (Se), germanium (Ge), silicon (Si), arsenic (As), titanium (Ti), sulfur (S) and antimony (Sb).

The first barrier layer 123 can provide adhesion and diffusion barrier functions between the switch element 121 and the memory element 122. The first barrier layer 123 may have a layer of conductive material with a thickness of about 5 to about 50 nm, preferably about 20 nm. Example materials for the first barrier layer 123 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, first barrier layer 123 can comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

The second barrier layer 125 can provide adhesion and diffusion barrier functions between the switch element 121 and the first access line 111. The second barrier layer 125 can have the same material as the first barrier layer 123, such as TiN. In some embodiments, the second barrier layer 125 can have a different material than the first barrier layer 123. In some embodiments, the second barrier 125 can be eliminated such that the switch element 121 is in contact with the first access line 111.

The memory element 122 can comprise a layer of programmable resistance material, for example, a layer of phase change material having a thickness of about 10 nm to about 50 nm, preferably about 30 nm. The thickness of the phase change memory element can be greater than the thickness of switch element 121 in some embodiments. The memory element 122 can comprise, for example, $Ge_2Sb_2Te_5$, in a pure stoichiometric form or in a form with additives or dopants, such as dielectric additives. Phase change materials are capable of being switched between a relatively high resistance state, amorphous phase, and a relatively low resistance state, crystalline phase, by application of energy such as heat or electrical current. In some embodiments, multilevel cells having multiple resistance states can be used.

Embodiments of materials for the memory element 122 can include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example $Ge_2Sb_2Te_5$, $GeSb_2Te_4$ and $GeSb_4Te_7$. More generally, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials that may be useful are disclosed in Ovshinsky, U.S. Pat. No. 5,687,112 at columns 11-13, which examples are incorporated by reference.

The memory element 122 can comprise a layer of chalcogenide and other phase change materials with additives to modify conductivity, transition temperature, melting temperature, and other properties. Representative additives can include nitrogen (N), silicon (Si), oxygen (O), silicon oxide (SiOx), silicon nitride (SiN), copper (Cu), silver (Ag), gold (Au), aluminum (Al), aluminum oxide ($Al_2O_3$), tantalum (Ta), tantalum oxide (TaOx), tantalum nitride (TaN), titanium (Ti), and titanium oxide (TiOx).

In some embodiments, other resistive memory structures can be implemented, such as metal-oxide resistive memories, magnetic resistive memories and conducting-bridge resistive memories.

The first access lines (bit lines) and the second access lines (word lines) can comprise a variety of metals, metal-like materials and doped semiconductors, or combinations thereof. Embodiments of the first and second access lines can be implemented using one or more layers of materials like tungsten (W), aluminum (Al), copper (Cu), titanium nitride (TiN), tantalum nitride(TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker. The material selected for the second access lines is preferably selected for compatibility with the memory element 122. Likewise, the material selected for the first access lines is preferably selected for compatibility with the second barrier layer 125.

In another embodiment, a bottom electrode (not shown) having a smaller contact surface than the surface of the memory element is interposed between the memory element 122 and the switch element 121 or between the memory element 122 and the second access line 101. As such, an increased current density at the contact in the memory element can be achieved. Such bottom electrode may comprise titanium nitride (TiN), tantalum nitride (TaN), titanium silicon nitride (TiSiN), titanium aluminum nitride (TiAlN), tantalum aluminum nitride (TaAlN), and tungsten nitride (WN). The bottom electrode in contact with the active region of the phase change material is sometimes referred to as a "heater," reflecting embodiments in which the electrode can have relatively high resistance, and contributes to the Joule heating in the active region of the phase change material.

In embodiments described herein, the voltages applied during read operations on the first and second access lines connected to a given cell at their cross point can be one of Vr and ground (Vref), Vr and Vu, or Vu and Vu. In embodiments described herein, the voltages applied during set or reset write operations on the first and second access lines connected to a given cell at their cross point can be one of Vw and ground (Vref), Vw and Vu, or Vu and Vu.

Figure 3:
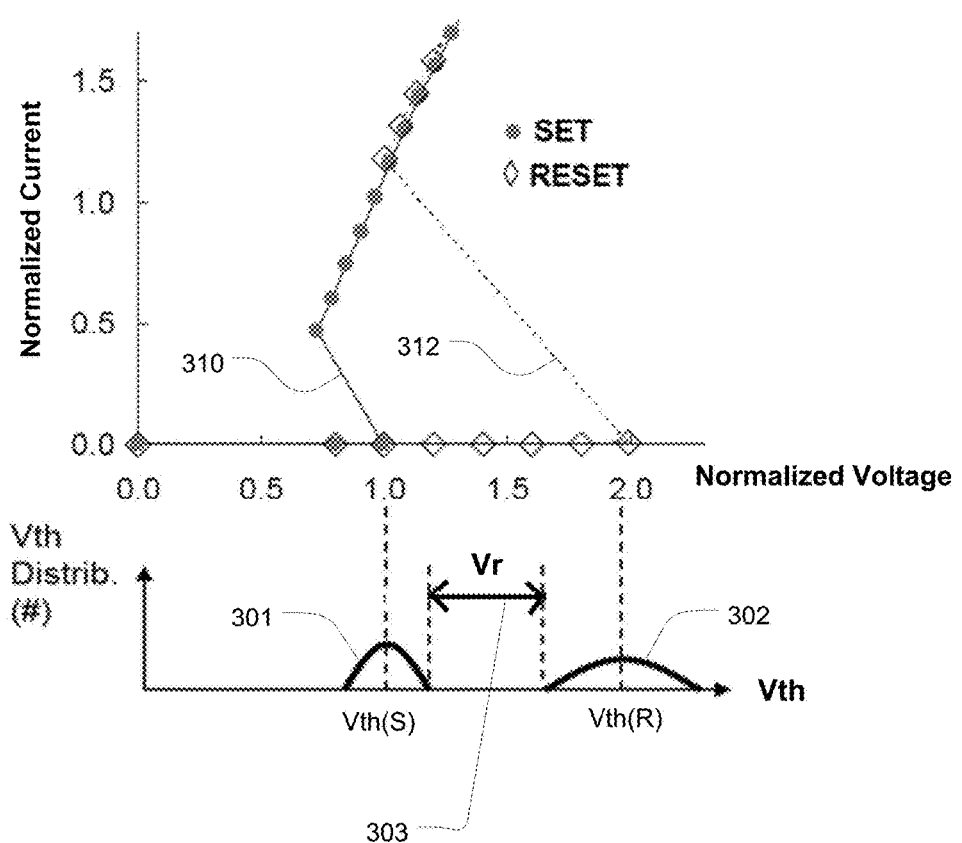
FIG. 3 is a graph illustrating an I-V curve of a memory cell and the corresponding threshold voltage distribution in the SET and RESET states.

FIG. 3 is a graph illustrating an curve of a memory cell having a cell structure that provides switch function and data storage function, like a memory cell with a phase change memory element in series with an ovonic threshold switch like that of FIG. 2, and a graph of the corresponding threshold voltage distribution in the SET and RESET states. The OTS switches between the off and on states depend on an applied electrical current or voltage that exceeds a threshold current or threshold voltage. When a voltage applied is less than the threshold voltage of the OTS, the OTS remains in the off state such that little or no electrical current flows through the memory cell. When a voltage applied is greater than the threshold voltage of the OTS, the OTS can switch to the on state and allow current to pass through the memory cell.

In FIG. 3, curve 310 exhibits the I-V characteristics of the memory cell when the phase change memory element is in a lower resistance set state. As the voltage increases, the memory cell exhibits little or no current until a threshold Vth(S) about 1.0 unit is reached. Then the switching element snaps back to a lower resistance, changing voltage dividing effect on the series switch and memory element, and increasing current flow. Curve 312 exhibits the I-V characteristics for the phase change memory element in a reset state. Similarly, as the voltage increases, the memory cell exhibits little or no current until a threshold voltage about 2.0 units is reached. Upon reaching the threshold Vth(R) for the reset state, the memory cell snaps back to much lower resistance and higher current. In the either set or reset state, once the threshold voltage is reached, the memory cell shows higher conductivity suitable for read and write operations.

The graph of threshold voltage distribution shows a distribution 301 for the set state threshold Vth(S), and a distribution 302 for the reset state threshold Vth(R). During a read operation, a read voltage Vr in the range 303 is applied across the memory cell. Vr is greater than the threshold voltage Vth(S) of the set state and less than the threshold voltage Vth(R) of the reset state, i.e. Vth(R)>Vr>Vth(S). When the cell being read is in a set state, Vr turns on the switch element and a read current flows in the cell. On the other hand, when the cell is in the reset state, Vr is not sufficient to turn on the switch and a small or no current flows. Sense amplifiers sense the distinction in current flow in the two conditions to read the data value.

Figure 4:
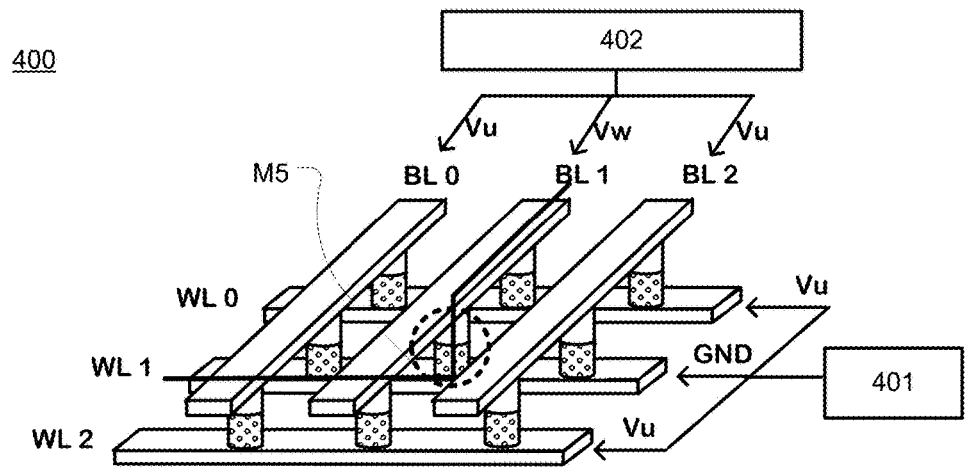
FIG. 4 illustrates a first bias arrangement applied to a level in a 3D cross-point array during a write operation.

FIG. 4 illustrates an example of a first bias arrangement applied to a level 400 in a 3D cross-point array during a write operation. In the level 400, memory cells are disposed at cross points between first access lines, such as bit lines BL0, BL1, and BL2, and second access lines, such as word lines WL0, WL1, and WL2. Among these memory cells, a memory cell M5 is selected to write data into in a write operation. The write operation can be a set operation, which changes the memory element in the selected memory cell from a relatively high resistance state (amorphous phase) to a relatively low resistance state (polycrystalline or crystalline phase). The write operation can be a reset operation, which changes the memory element in the selected memory cell from a relatively low resistance state to a relatively high resistance state. A second access line driver 401, which can be responsive to decoded addresses, is coupled to the second access lines, such as word lines WL0, WL1, and WL2, and control circuitry (not shown), is coupled to the second access line driver 401 which is configured to apply a reference voltage to a selected second access line WL1, connecting the selected memory cell M5, and to apply an inhibit voltage Vu to unselected second access lines WL0 and WL2. A first access line driver 402 which can be responsive to decoded addresses, is coupled to the first access lines, such as bit lines BL0, BL1, and BL2, and the control circuitry (not shown) is coupled to the first access line driver 402, which is configured to apply a write voltage Vw to a selected first access line BL1, connecting the selected memory cell M5, and to apply the same inhibit voltage Vu to unselected first access lines BL0 and BL2.

Figure 5:
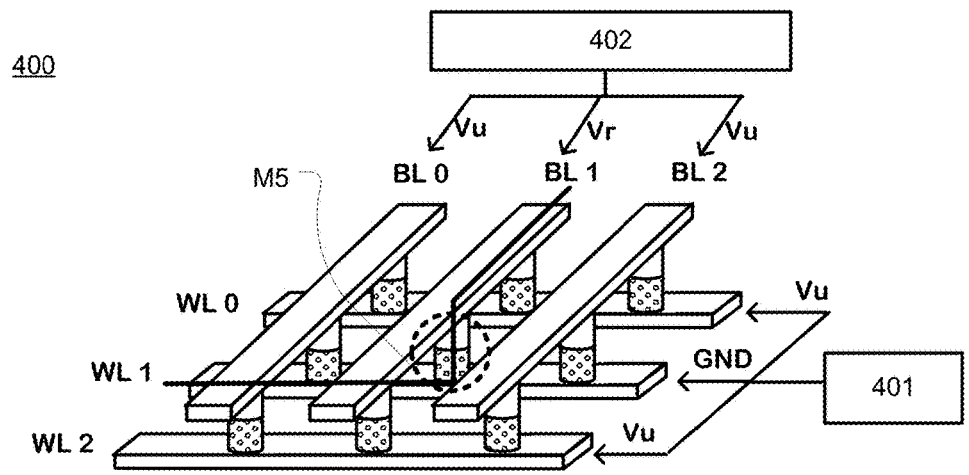
FIG. 5 illustrates a second bias arrangement applied to a level in a 3D cross-point array during a read operation.

FIG. 5 illustrates an example of a second bias arrangement applied to a level 400 in a 3D cross-point array during a read operation. The read operation can also be used to verify a write operation, such as an instance of verify following an instance of write. Among the memory cells, memory cell M5 is selected in a read operation. The second access line driver 401 connected to the second access lines, such as word lines WL0, WL1, and WL2, is coupled to control circuitry (not shown). The control circuitry is configured to apply a reference voltage to a selected second access line WL1 connecting the selected memory cell M5, and to apply an inhibit voltage Vu to unselected second access lines WL0 and WL2. A first access line driver 402 connected to the first access lines, such as bit lines BL0, BL1, and BL2, is coupled to the control circuitry (not shown). The control circuitry is configured to apply a read voltage Vr to a selected first access line BL1 connecting the selected memory cell M5, and to apply the same inhibit voltage Vu to unselected first access lines BL0 and BL2.

Comparing FIGS. 4 and 5, the controller applies different voltages, Vw and Vr, to only the selected first access line BL1 in the write and read operations, respectively. As to the unselected first and second access lines, the first and second bias arrangements include the same inhibit voltage Vu during the write and read operations. In this example, the reference voltage is ground during the write and read operations. As a result of the same inhibit voltage Vu applied on the unselected first and second access lines in the write and read operations, such bias arrangements would save time and power for pre-charges in transitions between write and read operations.

Figure 6:
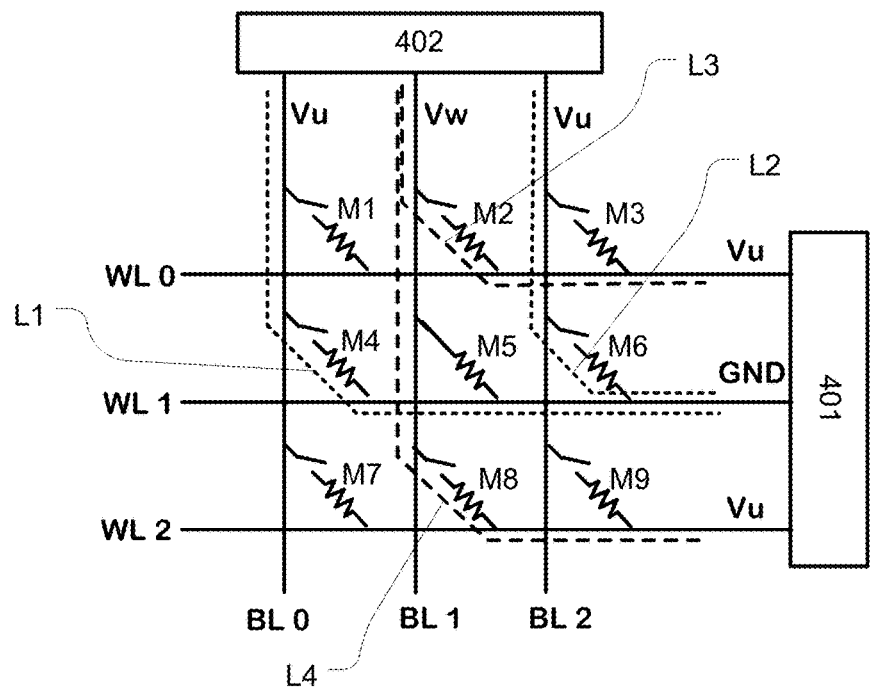
FIG. 6 illustrates leakage currents resulting from the bias arrangement of FIG. 4 during a write operation in one embodiment.

FIG. 6 illustrates leakage currents resulting from the first bias arrangement of FIG. 4 during a write operation. Among the unselected memory cells, memory cells M1, M3, M7, and M9 do not exhibit significant leakage currents because the associated first and second access lines are biased at the same voltage level. However, memory cells M4 and M6 may exhibit leakage currents L1 and L2, respectively. The leakage currents L1, L2 can be attributed to the voltage difference Vu between the unselected first access lines BL0, BL2 and the selected second access line WL1.

The voltage difference Vu across the unselected first access line and the selected second access line has to be less than the threshold voltage Vth(S) of the set state so that unselected memory cells M4 and M6 do not turn on.

$$Vu < Vth(S) \quad \text{Equation (1):}$$

Similarly, memory cells M2 and M8 exhibit leakage currents L3 and L4, respectively, which are attributed to the voltage difference Vw-Vu between the unselected second access lines WL0, WL2 and the selected first access line BL1.

The bias difference Vw-Vu crossing the unselected second access line and the selected first access line has to be less than the threshold voltage Vth(S) of the set state as well, so that unselected memory cells M2 and M8 do not turn on.

$$Vw - Vu < Vth(S) \quad \text{Equation (2):}$$

$$\Rightarrow Vu > Vw - Vth(S) \quad \text{Equation (3):}$$

$$\Rightarrow Vth(S) + Vu > Vw \quad \text{Equation (4):}$$

From equations (1) and (3), it is derived that Vu can be in a range defined as follows:

$$Vth(S) > Vu > Vw - Vth(S) \quad \text{Equation (5):}$$

In either a set or a reset operation, the write voltage Vw has to be greater than the threshold voltage of the reset state Vth (R), i.e.

$$Vw > Vth(R). \quad \text{Equation (6):}$$

From equation (1) and equation (2), it is derived that $$Vu < \tfrac{1}{2}Vw. \quad \text{Equation (7):}$$

In addition, from equations (3) and (7), it is derived that the range of Vu can be:

$$\tfrac{1}{2}Vw > Vu > Vw - Vth(S) \quad \text{Equation (8):}$$

From equations (4) and (6), it is derived that the range of Vw can be:

$$Vth(S) + Vu > Vw > Vth(R) \quad \text{Equation (9):}$$

The write pulse needed for set and reset operations is required to melt the memory element and then followed by slow-quenching (SET) or rapid-quenching (RESET) a volume of the memory element. The write pulse can include a leading edge, a tailing edge and an intermediate segment between the leading edge and the tailing edge. The tailing edge of a write pulse for slow-quenching (SET) can have a longer period than that for rapid-quenching (RESET). Thus, the write voltage Vw can be the same for both set and reset. In some embodiments, the write voltage Vw can be different for set Vw(S) and reset Vw(R), in which case the ranges specified above must be applied to the different Vw(R) and Vw(S) for both to prevent turning on unselected memory cells.

In sum, the first bias arrangement for a write operation includes a write voltage Vw on a selected first access line in the plurality of first access lines, a reference voltage on a selected second access line in the plurality of second access lines, and an inhibit voltage Vu on unselected first and second access lines, where:

$$\tfrac{1}{2}Vw > Vu > Vw - Vth(S) \text{ or } Vth(S) > Vu > Vw - Vth(S) \quad \text{Equation (10):}$$

Figure 7:
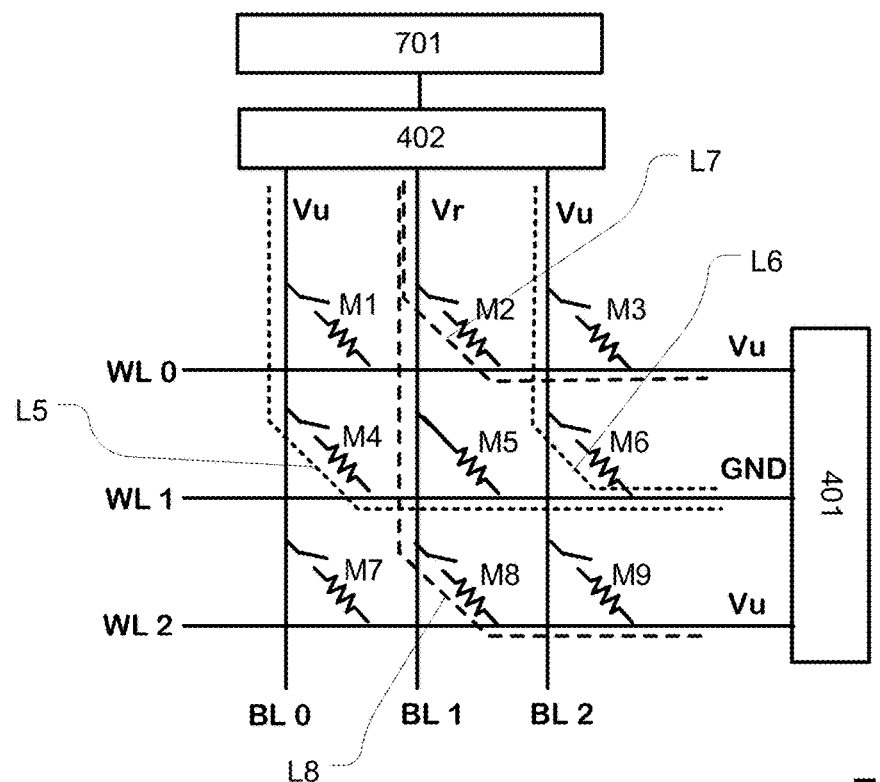
FIG. 7 illustrates leakage currents resulting from the bias arrangement of FIG. 5 during a read operation in one embodiment.

FIG. 7 illustrates leakage currents resulting from the bias arrangement shown in FIG. 5 during a read operation in one embodiment. Among the unselected memory cells, memory cells M1, M3, M7, and M9 do not exhibit significant leakage currents because the associated first and second access lines are biased at the same voltage level. However, memory cells M4 and M6 may exhibit leakage currents L5 and L6, respectively, which can be attributed to the voltage difference Vu to GND between the unselected first access lines BL0, BL2 and the selected second access line WL1. Similarly, memory cells M2 and M8 exhibit leakage currents L7 and L8, respectively, due to the voltage difference Vr-Vu between the unselected second access lines WL0, WL2 and the selected first access line BL1.

As previously described with reference to FIG. 3, the read voltage Vr has a range as:

$$Vth(R) > Vr > Vth(S) \quad \text{Equation (11):}$$

The bias difference resulting in leakage has to be less than the SET threshold voltage, i.e.

$$Vr - Vu < Vth(S) \quad \text{Equation (12):}$$

and $$Vu < Vth(S) \quad \text{Equation (13):}$$

By adding up equations (12) and (13), $$Vr < 2Vth(S) \quad \text{Equation (14):}$$

From equations (11) and (14), the Vr range can be $$2Vth(S) > Vr > Vth(S) \quad \text{Equation (15):}$$

Also, based on these equations, it is seen that Vw<2Vth(S). So, the range of Vw also can be $$2Vth(S) > Vw > Vth(R) \quad \text{Equation (16):}$$

In this embodiment, as a result of Vr−Vu<Vu, the overall leakage current (i.e. L7+L8) on the selected first access line BL1 is less than the overall leakage current (i.e. L5+L6) on the selected second access line WL1. Therefore, a plurality of sense amplifiers 701 is configured to couple to the first access lines through the first access line driver 402.

In sum, the second bias arrangement for a read operation includes a read voltage Vr on the selected first access line in the plurality of first access lines, the reference voltage on the selected second access line in the plurality of second access lines, and the same inhibit voltage Vu on the unselected first and second access lines, where Vth(R)>Vr>Vth(S).

Figure 8:
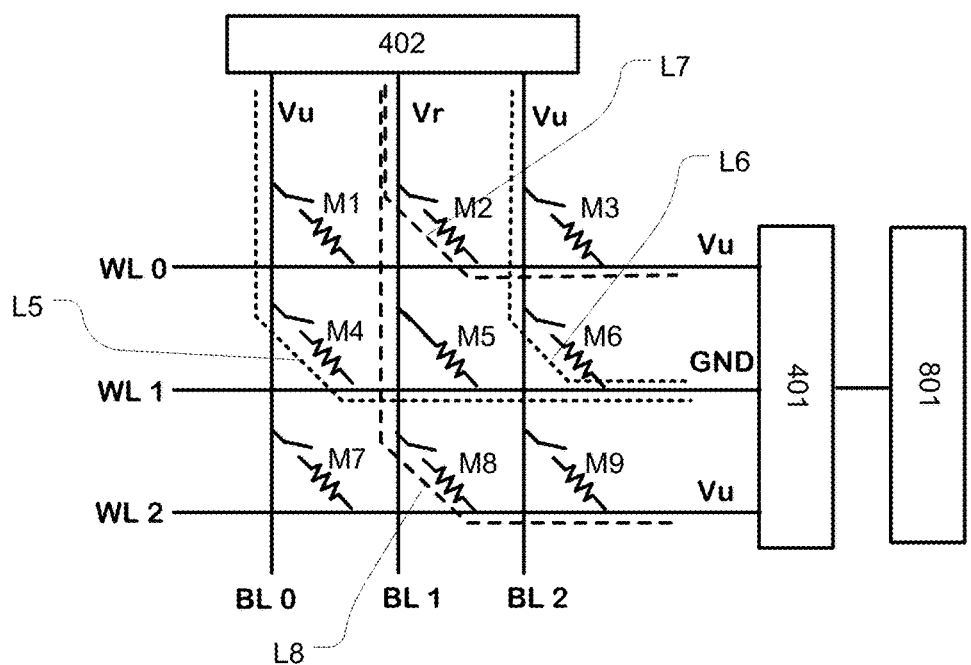
FIG. 8 illustrates leakage currents resulting from the bias arrangement of FIG. 5 during a read operation in another embodiment.

FIG. 8 illustrates leakage currents resulting from the bias arrangement of FIG. 5 during a read operation in another embodiment. FIG. 8 differs from FIG. 7 in the way of connecting a plurality of sense amplifiers 801 to the cross-point array. In this embodiment, because of Vr−Vu>Vu, the overall leakage on the selected second access line WL1 is less than that on the selected first access line BL1. Therefore, the plurality of sense amplifiers 801 is configured to couple to the second access lines through the second access line driver 401.

Figure 9:
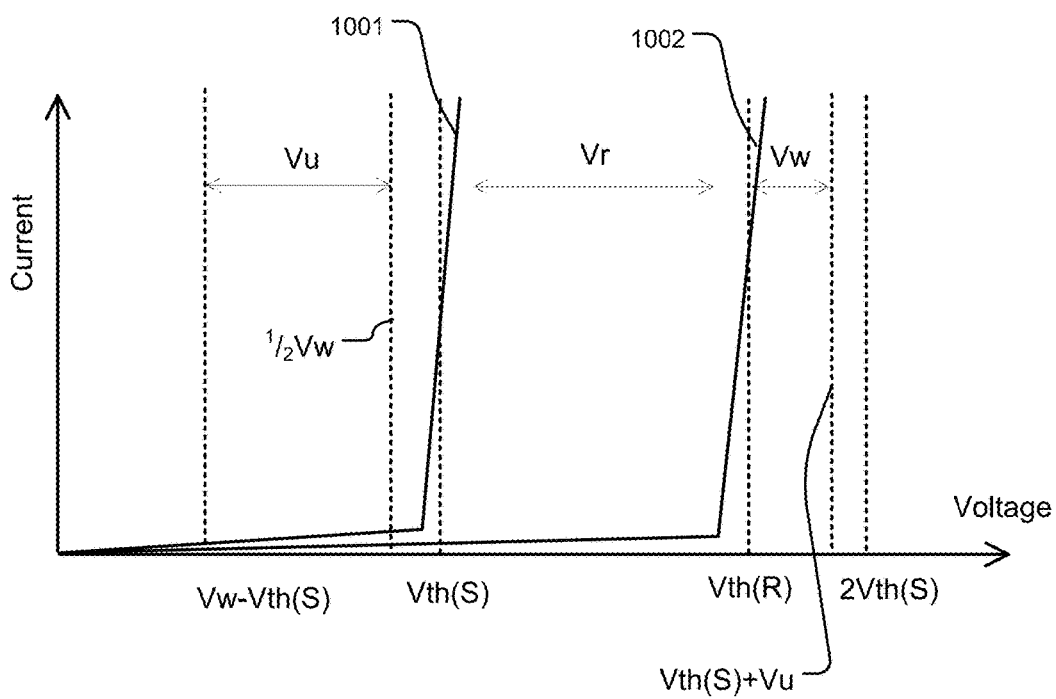
FIG. 9 is a graph illustrating the correlation of the voltages applied in the write and read operations.

FIG. 9 is a current vs. voltage graph illustrating the write and read operations. Line 1001 is the curve when the memory element is in the set state with a threshold Vth(S), and line 1002 is the curve when the memory element is in the reset state with a threshold Vth(R). As described previously, the voltages correlate as: $Vu<Vr<Vw$. The inhibit voltage Vu applied to the unselected first and second access lines has to satisfy $\frac{1}{2}Vw>Vu>Vw-Vth(S)$ or $Vth(S)>Vu>Vw-Vth(S)$. The write voltage Vw applied to the selected first access line has the range: $Vth(S)+Vu>Vw>Vth(R)$ or $2Vth(S)>Vw>Vth(R)$.

Figure 10:
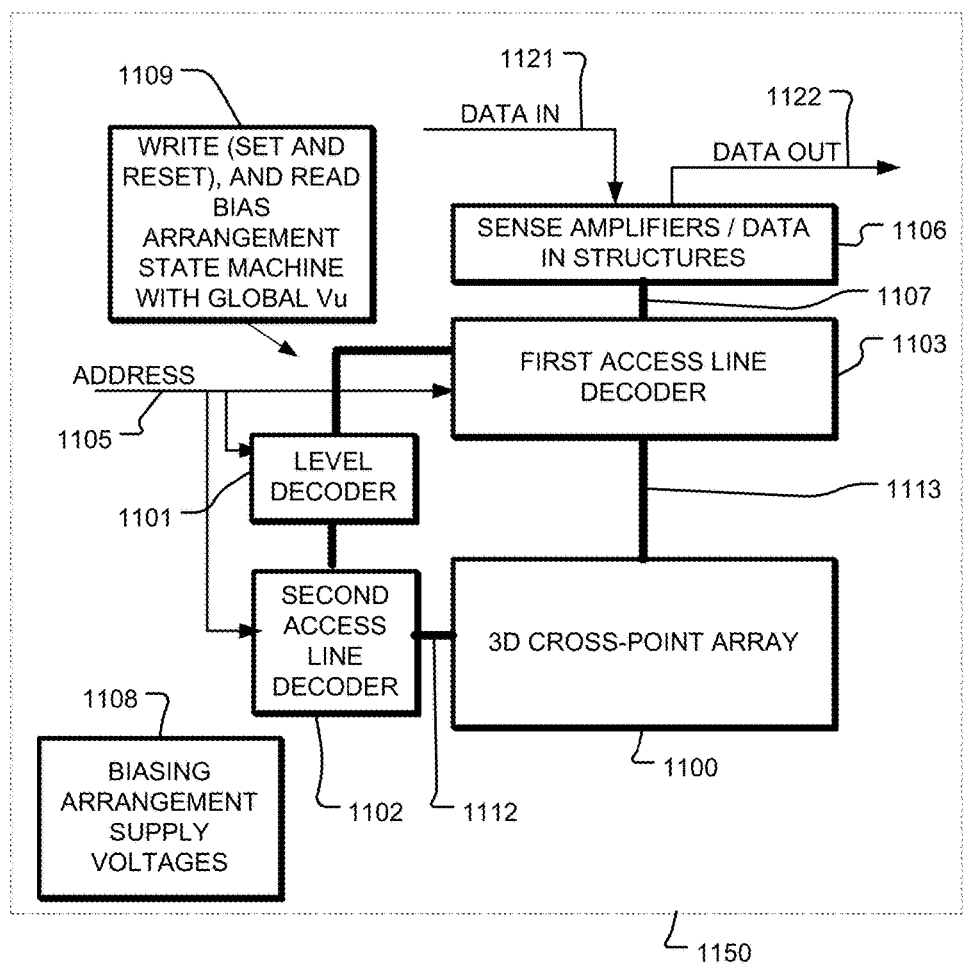
FIG. 10 is a block diagram of an integrated circuit 1150 including a 3D cross-point array 1100, to which bias arrangements as described during read and write operations are applied.

FIG. 10 shows an integrated circuit 1150 including a 3D cross-point array 1100 comprising a memory cell having a switch element in series connection with a memory element. A level decoder 1101 is coupled to and in electrical communication with a second access line decoder 1102 and a first access line decoder 1103. The second access line decoder 1102 is coupled to, and in electrical communication with, a plurality of second access lines 1112, and arranged as rows in the 3D cross-point array 1100. The second access line decoder 1102 can comprise second access line drivers. The first access line decoder 1103 is coupled to and in electrical communication with a plurality of first access lines 1113 arranged as columns in the 3D cross-point array 1100 for reading data from, and writing data to, the memory cells in the 3D cross-point array 1100. The first access line decoder 1103 can comprise first access line drivers. Addresses are supplied on bus 1105 to the level decoder 1101, second access line decoder 1102, and first access line decoder 1103. Sense amplifiers and other supporting circuitry such as pre-charge circuits and so on, along with data-in structures in block 1106, are coupled to the first access line decoder 1103 via the bus 1107 in this embodiment. In some embodiments, the sense amplifiers are coupled to the second access line decoder 1102 when an overall leakage current on the second access line side is less than that on the first access line side. In some embodiments, the sense amplifiers can be independent of the data-in structures in block 1106. Data is supplied via the data-in line 1121 from input/output ports on the integrated circuit 1150 or other data sources, to the data-in structures in block 1106. Data is supplied via the data-out line 1122 from the sense amplifiers in block 1106 to input/output ports on the integrated circuit 1150, or to other data destinations internal or external to the integrated circuit 1150. A bias arrangement state machine is in control circuitry 1109, controlling biasing arrangement supply voltages 1108 as described with a global Vu so that the voltage on unselected access lines is unchanged on transitions between read and write operations, Also, the control circuitry coordinates operation of sense circuitry and the data-in structures in block 1106, for read and write operations. The circuitry can be implemented using special purpose logic, a general purpose processor or a combination thereof, configured to execute the read, write and erase operations While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit, comprising:
   a plurality of memory cells disposed at cross points of a plurality of first access lines and a plurality of second access lines, a selected memory cell in the plurality of memory cells connecting a selected first access line and a selected second access line having a first threshold voltage $Vth(S)$ when the selected memory cell is in a set state and a second threshold voltage $Vth(R)$ when the selected memory cell is in a reset state; and
   control circuitry configured to apply a write voltage Vw across the selected first access line and the selected second access line of a selected memory cell during a write operation, to apply a read voltage Vr across the selected first access line and the selected second access line of a selected memory cell during a read operation, and to apply a same inhibit voltage Vu to unselected first access lines and second access lines during the write and read operations, where $\frac{1}{2}Vw>Vu>Vw-Vth(S)$.

2. The integrated circuit of claim 1, wherein memory cells in the plurality of memory cells respectively include a switch element comprising an ovonic threshold switch, and a memory element comprising a programmable resistance material.

3. The integrated circuit of claim 1, wherein $Vr-Vu<Vu$, and further comprising a plurality of sense amplifiers coupled to the plurality of first access lines.

4. The integrated circuit of claim 1, wherein $Vr-Vu>Vu$, and further comprising a plurality of sense amplifiers coupled to the plurality of second access lines.

5. The integrated circuit of claim 1, wherein the write voltage Vw has a range: $Vth(S)+Vu>Vw>Vth(R)$.

6. The integrated circuit of claim 1, wherein the write operation includes set or reset operations.

7. The integrated circuit of claim 6, wherein write pulses used for the set and reset operations have different trailing edge shapes.

8. The integrated circuit of claim 1, wherein the control circuitry is configured to apply a reference voltage to the selected second access line during the write and read operations.

9. The integrated circuit of claim 1, wherein the plurality of memory cells comprise a portion of a 3D array.

10. A method of writing a selected memory cell in a memory array, the memory array including a plurality of first access lines and a plurality of second access lines, the selected memory cell having a first threshold voltage $Vth(S)$ when the memory cell is in a set state and a second threshold voltage $Vth(R)$ when the memory cell is in a reset state, the method comprising:
    applying a write voltage Vw across a selected first access line and a selected second access line connected to the selected memory cell in a write operation;
    applying a read voltage Vr across the selected first access line and the selected second access line connected to the selected memory cell in a read operation; and
    applying a same inhibit voltage Vu to unselected first and second access lines in the write operation and the read operation, where $\frac{1}{2}Vw>Vu>Vw-Vth(S)$.

11. The method of claim 10, wherein $Vr-Vu<Vu$, and further comprising sensing a current through the selected memory cell using a sense amplifier coupled to the selected first access line.

12. The method of claim 10, wherein $Vr-Vu>Vu$, and further comprising sensing a current through the selected memory cell using a sense amplifier coupled to the selected second access line.

13. The method of claim 10, wherein memory cells in the memory array respectively include a switch element comprising an ovonic threshold switch, and a memory element comprising a programmable resistance material.

14. The method of claim 10, further comprising applying a reference voltage to a selected second access line.

15. The method of claim 10, wherein said applying the write voltage Vw changes the selected memory cell to the set state.

16. The method of claim 10, wherein said applying the write voltage Vw changes the selected memory cell to the reset state.

17. The method of claim 10, wherein the write operation includes applying a write pulse followed by a verify read pulse to the selected first access line, and maintaining the inhibit voltage on the unselected first access lines and unselected second access lines during the write pulse and the verify read pulse.

18. An integrated circuit, comprising:
a memory array including a plurality of memory cells disposed at respective cross points of a plurality of first access lines and a plurality of second access lines, each memory cell including an ovonic threshold switch element and a programmable resistance memory element, and having a first threshold voltage Vth(S) when the memory element is in a set state, and having a second threshold voltage Vth(R) when the memory element is in a reset state;
a plurality of first drivers coupled to the plurality of first access lines;
a plurality of second drivers coupled to the plurality of second access lines; and
control circuitry coupled to the plurality of first drivers and the plurality of second drivers, and configured to provide a first bias arrangement in a write operation and a second bias arrangement in a read operation;
wherein the first bias arrangement includes a write voltage Vw on a selected first access line in the plurality of first access lines, a reference voltage on a selected second access line in the plurality of second access lines, and an inhibit voltage Vu on unselected first and second access lines, where ½Vw>Vu>Vw−Vth(S); and
wherein the second bias arrangement includes a read voltage Vr on the selected first access line in the plurality of first access lines, the reference voltage on the selected second access line in the plurality of second access lines, and the same inhibit voltage Vu on the unselected first and second access lines, where Vth(R)>Vr>Vth(S).

19. The integrated circuit of claim 18, wherein Vr−Vu<Vu, and further comprising a plurality of sense amplifiers coupled to the plurality of first access lines.

20. The integrated circuit of claim 18, wherein Vr−Vu>Vu, and further comprising a plurality of sense amplifiers coupled to the plurality of second access lines.

* * * * *